(12) United States Patent
Lee et al.

(10) Patent No.: US 6,847,536 B1
(45) Date of Patent: Jan. 25, 2005

(54) SEMICONDUCTOR MEMORY DEVICE HAVING STRUCTURE FOR PREVENTING LEVEL OF BOOSTING VOLTAGE APPLIED TO A NODE FROM DROPPING AND METHOD OF FORMING THE SAME

(75) Inventors: Jung-Hwa Lee, Suwon-si (KR); Soo-Bong Chang, Seoul (KR)

(73) Assignee: Samsung Electronics Co., LTD, Gyeonggi-do (KR)

( * ) Notice: Subject to any disclaimer, the term of this patent is extended or adjusted under 35 U.S.C. 154(b) by 0 days.

(21) Appl. No.: 10/889,495

(22) Filed: Jul. 12, 2004

(30) Foreign Application Priority Data

Jul. 19, 2003 (KR) .................................. 10-2003-0049548

(51) Int. Cl.[7] .................................................. G11C 5/02
(52) U.S. Cl. ............................ 365/51; 365/63; 257/296
(58) Field of Search ...................... 365/63, 51, 230.06; 257/71, 296, 306

(56) References Cited

U.S. PATENT DOCUMENTS 6,163,474 A * 12/2000 Prasanna et al. .............. 365/52
6,295,222 B2 * 9/2001 Higashide et al. ............. 365/63
6,594,167 B1 * 7/2003 Yamasaki et al. ............. 365/51
6,657,871 B2 * 12/2003 Perino et al. ................ 361/760
6,765,814 B2 * 7/2004 Nishihara et al. ............. 365/63

* cited by examiner

*Primary Examiner*—Andrew Q. Tran
(74) *Attorney, Agent, or Firm*—F Chau & Associates, LLC

(57) ABSTRACT

A semiconductor memory device includes a column decoder, a row decoder, a memory cell array block, and a sense amplifier block. The sense amplifier block is disposed adjacent to the memory cell array block. The column decoder is disposed at one side of the memory cell array block, and the row decoder is disposed at another side of the memory cell array block. First output lines of the row decoder pass over the sense amplifier block and are formed of first metal layers. Second output lines of the row decoder pass over the memory cell array block and are formed of second metal layers. Output lines of the column decoder pass over the sense amplifier block and the memory cell array block. Portions of the output lines of the column decoder passing over the sense amplifier block are formed of the second metal layers and portions of the output lines of the column decoder that pass over the memory cell array block are formed of the first metal layers.

18 Claims, 5 Drawing Sheets

SEMICONDUCTOR MEMORY DEVICE HAVING STRUCTURE FOR PREVENTING LEVEL OF BOOSTING VOLTAGE APPLIED TO A NODE FROM DROPPING AND METHOD OF FORMING THE SAME

BACKGROUND

This application claims priority based on Korean Patent Application No. 2003-49548, filed on Jul. 19, 2003, in the Korean Intellectual Property Office, the disclosure of which is incorporated herein in its entirety by reference.

1. Technical Field

The present disclosure relates to a semiconductor memory device, and more particularly, to a semiconductor memory device having a structure for preventing the level of a boosting voltage applied to a node from dropping.

2. Discussion of Related Art

A semiconductor memory device has various internal power voltage levels. In particular, a boosting power voltage (VPP) level is higher than a general power voltage (VDD) level and is considered to be at a negative voltage level (VBB) when lower than a ground voltage (VSS).

However, it is quite difficult to increase driving capability while the boosting power voltage (VPP or VBB) level is maintained. Also, the boosting power voltage (VPP or VBB) level may require an increase in size of a semiconductor chip.

In a semiconductor memory device, a specific node to which a boosting power voltage (VPP or VBB) is applied is electrically connected to another node. As a result, the level of the boosting power voltage (VPP or VBB) of the specific node may drop due to fine particles.

A memory cell array with a relatively large area is greatly affected by the fine particles. For example, output lines of a row decoder are formed of metal layers over the memory cell array and are connected to a sub word line driver including a p-channel metal-oxide semiconductor (PMOS) transistor. The output lines of the row decoder are at a boosting power voltage (VPP) level, and at a negative boosting voltage (VBB) level in a negative word line source scheme. When the output lines of the row decoder are at the negative boosting voltage (VBB) level, a bridge is formed between the output lines and a cell plate under the output lines due to fine particles. Thus, stand-by current increases, and the negative boosting voltage (VBB) level increases to the same voltage level as the cell plate. As a result, the semiconductor chip may exhibit a defect.

FIG. 1 is a schematic view of an array signal structure according to a conventional semiconductor memory device. Referring to FIG. 1, a semiconductor memory device 100 includes a memory cell array block (MCAB), a sense amplifier (S/A) block, a row decoder 110, and a column decoder 120.

The row decoder 110 outputs a normal word line enable (NWE) signal to a sub word line driver (SWD). The SWD outputs the NWE signal to a lower layer or an active area via a metal contact (MC), a direct contact (DC), or the like.

The NWE signal is transmitted via output lines RDOUT of the row decoder 110. The output lines RDOUT of the row decoder 110 are first metal layers.

In the S/A block, the column decoder 120 outputs a column select line (CSL) signal to the first metal layers via a via contact (VC) and to a column select line transistor (not shown) via the MC, DC, or the like.

The CSL signal is transmitted via output lines CDOUT of the column decoder 120. The output lines CDOUT of the column decoder 120 are second metal layers.

The output lines RDOUT of the row decoder 110 in the semiconductor memory device 100 are the first metal layers, and the output lines CDOUT of the column decoder 120 are the second metal layers. Also, the first metal layers are orthogonal to the second metal layers.

The second metal layers are disposed over the first metal layers. Thus, the output lines CDOUT of the column decoder 120 are disposed over the output lines RDOUT of the row decoder 110 in the MCAB or the S/A block.

FIG. 2 is a side view of an array signal structure according to the conventional semiconductor memory device shown in FIG. 1.

As shown in FIG. 2, the semiconductor memory device 100 includes storage-poly silicon (S_POLY), which is connected to an active area ACTIVE and is a component of a storage cell, and plate-poly silicon (P_POLY) which is a component of a cell capacitor.

Output lines RDOUT of a row decoder are first metal layers MT1 and are disposed over the plate-poly silicon P_POLY. Output lines CDOUT of a column decoder are second metal layers MT2 and are disposed over the first metal layers MT1 in an orthogonal direction.

The plate-poly silicon P_POLY encloses the entire storage-poly silicon S_POLY and generally has a half voltage level (½VCC) of a high level of data, which is the highest potential of the storage cell, to reduce an electric field of the cell capacitor.

As previously described, the output lines RDOUT of the row decoder are at a negative boost voltage (VBB) level in the negative word line source scheme.

However, since the output lines RDOUT of the row decoder, which are the first metal layers MT1, are disposed adjacent to the plate-poly silicon P_POLY, an electric bridge is formed between the output lines RDOUT of the row decoder and the plate-poly silicon P_POLY due to fine particles existing between the output lines RDOUT and the plate-poly silicon P_POLY.

Due to the electric bridge, stand-by current increases and the negative boosting voltage (VBB) level of the output lines RDOUT of the row decoder increases to the voltage level of the plate-poly silicon P_POLY. As a result, the semiconductor memory device 100 exhibits a defect.

SUMMARY OF THE INVENTION

A semiconductor memory device according to an embodiment of the invention includes a column decoder, a row decoder, a memory cell array block, and a sense amplifier block. The sense amplifier block is disposed adjacent to the memory cell array block. The column decoder is disposed at one side of the memory cell array block, and the row decoder is disposed at another side of the memory cell array block. First output lines of the row decoder pass over the sense amplifier block and are formed of first metal layers. Second output lines of the row decoder pass over the memory cell array block and are formed of second metal layers. Output lines of the column decoder pass over the sense amplifier block and the memory cell array block. Portions of the output lines of the column decoder passing over the sense amplifier block are formed of the second metal layers and portions of the output lines of the column decoder that pass over the memory cell array block are formed of the first metal layers.

Preferably, a normal word line enable signal is transmitted to the second output lines of the row decoder, which pass over the memory cell array block.

Preferably, a column select line signal is transmitted to the output lines of the column decoder.

Preferably, portions of the output lines of the column decoder which pass over the sense amplifier block are connected to portions of the output lines of the column decoder which pass over the memory cell array block via a via contact. Preferably, the second metal layers are disposed over the first metal layers.

A semiconductor memory device according to another embodiment of the invention includes a plurality of data storage cells, a plate-poly that encloses the data storage cells, first lines, and a first set of second lines. The first lines are disposed over the plate-poly and transmit a column select line signal. The first set of second lines is disposed over the first lines and transmits a normal word line enable signal. Preferably, the first lines are orthogonal to the second lines.

Preferably, the semiconductor memory device further includes a sense amplifier block, and a second set of second lines disposed over the sense amplifier block, the first lines being disposed over the second set of second lines.

Preferably, portions of the first lines over the sense amplifier block are connected to portions of the first lines over the plate-poly via a via contact.

A semiconductor memory device according to another embodiment of the invention includes first lines and second lines. The first lines pass over a memory cell array block and a sense amplifier block. The second lines pass over the memory cell array block and the sense amplifier block. The second lines are disposed over the first lines in the memory cell array block, and the first lines are disposed over the second lines in the sense amplifier block.

Preferably, the first lines are orthogonal to the second lines. Preferably, a column select line signal, which is output from a column decoder, is transmitted via the first lines. Preferably, a normal word line enable signal, which is output from a row decoder, is transmitted via the second lines.

Preferably, portions of the first lines over the sense amplifier block are connected to portions the first lines over the memory cell array block via a via contact.

A method of forming a semiconductor memory device according to an embodiment of the invention includes forming first lines which pass over a memory cell array block and a sense amplifier block, and forming second lines which pass over the memory cell array block and the sense amplifier block, the second lines disposed over the first lines in the memory cell array block, and the first lines disposed over the second lines in the sense amplifier block.

BRIEF DESCRIPTION OF THE DRAWINGS

The features of the present invention will become more apparent by describing in detail exemplary embodiments thereof with reference to the attached drawings in which.

DESCRIPTION OF PREFERRED EMBODIMENTS

Figure 1:
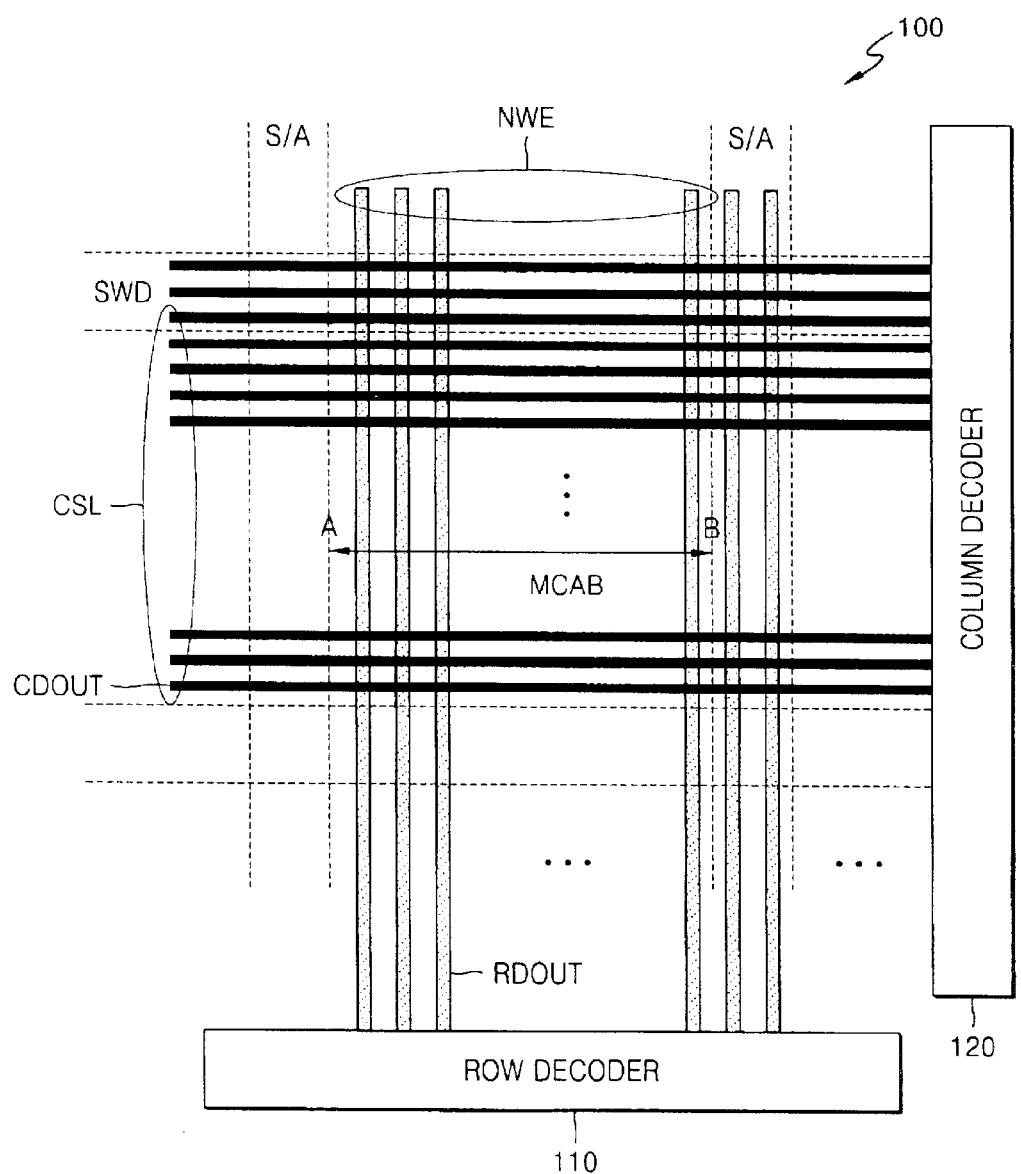
FIG. 1 is a schematic view of an array signal structure of a conventional semiconductor memory device.

Hereinafter, preferred embodiments of the present invention will be described in detail with reference to the attached drawings. Like reference numerals in the drawings denote like elements.

Figure 3:
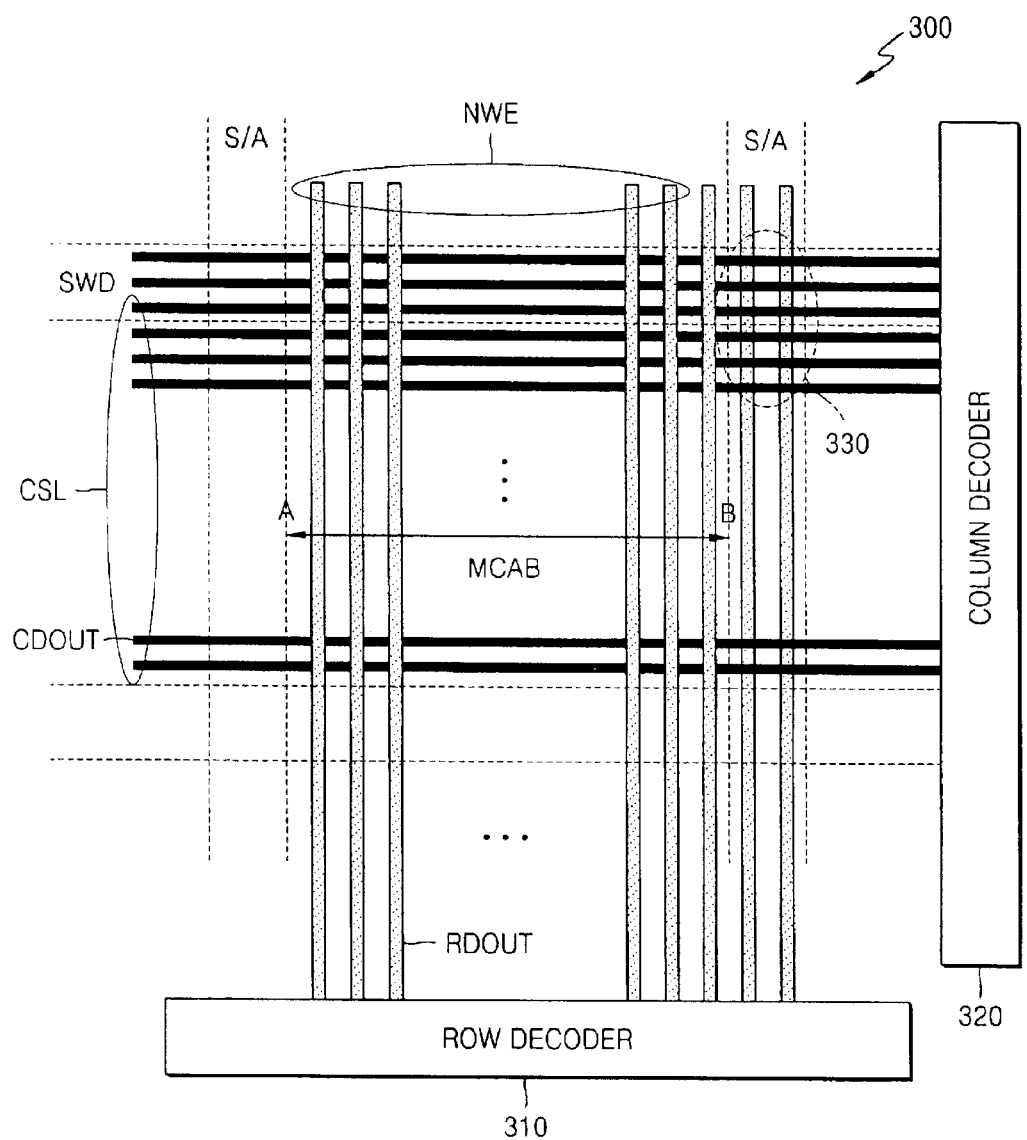
FIG. 3 is a schematic view of an array signal structure of a semiconductor memory device according to an embodiment of the present invention.

FIG. 3 is a schematic view of an array signal structure of a semiconductor memory device according to an embodiment of the present invention. Referring to FIG. 3, a semiconductor memory device 300 includes a column decoder 320, a row decoder 310, an MCAB, and an S/A block.

In the semiconductor memory device 300, output lines RDOUT of the row decoder 310, which pass over the MCAB, are formed of second metal layers, and output lines RDOUT of the row decoder 310, which pass over the S/A, are formed of first metal layers.

Output lines CDOUT of the column decoder 320, which pass over the MCAB, are formed of first metal layers, and output lines CDOUT of the column decoder 320, which pass over the S/A, are formed of second metal layers.

Here, the second metal layers are disposed over the first metal layers.

A NWE signal is transmitted to the output lines RDOUT of the row decoder 310 which pass over the MCAB. A column select line (CSL) signal is transmitted to the output lines CDOUT of the column decoder 320 which pass over the MCAB.

The output lines CDOUT of the column decoder 320 over the S/A block are connected to the output lines CDOUT of the column decoder 320 over the MCAB via a VC.

Hereinafter, the semiconductor memory device 300 will be explained in more detail with reference to FIG. 3.

If the output lines RDOUT of the row decoder 310 over the MCAB are formed of the first metal layers, i.e., the output lines CDOUT of the column decoder 320 are disposed over the output lines RDOUT of the row decoder 310, to prevent the output lines RDOUT of the row decoder 310 from electrically connecting with an upper electrode (hereinafter referred to as a plate-poly), the output lines RDOUT of the row decoder 310 over the S/A block are formed of the second metal layers. As a result, an additional area is required to connect the second metal layers to the first metal layers via the VC in the S/A block, which results in a relative increase in size of the semiconductor memory device 300.

Accordingly, the output lines RDOUT of the row decoder 310 over the MCAB over which an electric bridge may be formed due to fine particles are formed of the second metal layers, and the output lines RDOUT of the row decoder over the S/A block remain as the first metal layers.

In other words, the output lines RDOUT of the row decoder 310 are disposed over the output lines CDOUT of the column decoder 320 in the MCAB, while the output lines CDOUT of the column decoder 320 are disposed over the output lines RDOUT of the row decoder 310 in the S/A block.

As shown in FIG. 3, the output lines RDOUT of the column decoder 320 are formed of the second metal layers over the S/A block, and are formed of the first metal layers over blocks other than the S/A block.

The output lines CDOUT of the column decoder 320 formed of the first metal layers and the output lines CDOUT of the column decoder 320 formed of the second metal layers are connected with each other via the VC over both ends of the S/A block. As a result, a larger semiconductor memory device 300 is not required.

To be more specific, the output lines CDOUT of the column decoder 320, which pass over the S/A block, are connected to the output lines CDOUT of the column decoder 320, which pass over the MCAB, via the VC.

Figure 4:
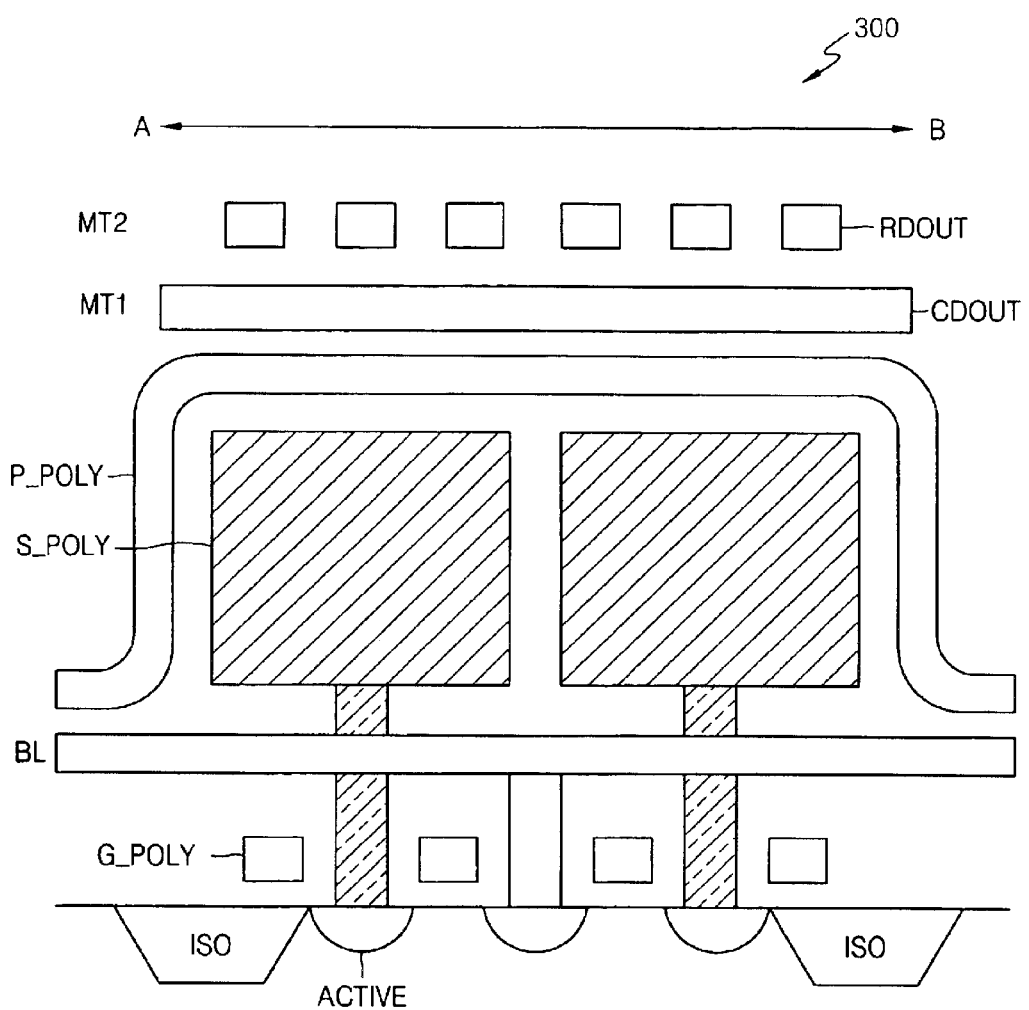
FIG. 4 is a side view of an array signal structure of the semiconductor memory device shown in FIG. 3.

FIG. 4 is a side view of an array signal structure of the semiconductor memory device shown in FIG. 3. Referring to FIG. 4, the semiconductor memory device 300 includes a plurality of data storage cells S_POLY, a plate-poly P_POLY enclosing the data storage cells S_POLY, first lines CDOUT, and second lines RDOUT.

The first lines CDOUT are disposed over the plate-poly P_POLY and transmit a CSL signal. In other words, the first lines CDOUT are the output lines CDOUT of the column decoder 320 of FIG. 3.

The second lines RDOUT are disposed over the first lines CDOUT and transmit a NWE signal. In other words, the second lines RDOUT are the output lines RDOUT of the row decoder 310 of FIG. 3. The first lines CDOUT are orthogonal to the second lines RDOUT.

Figure 2:
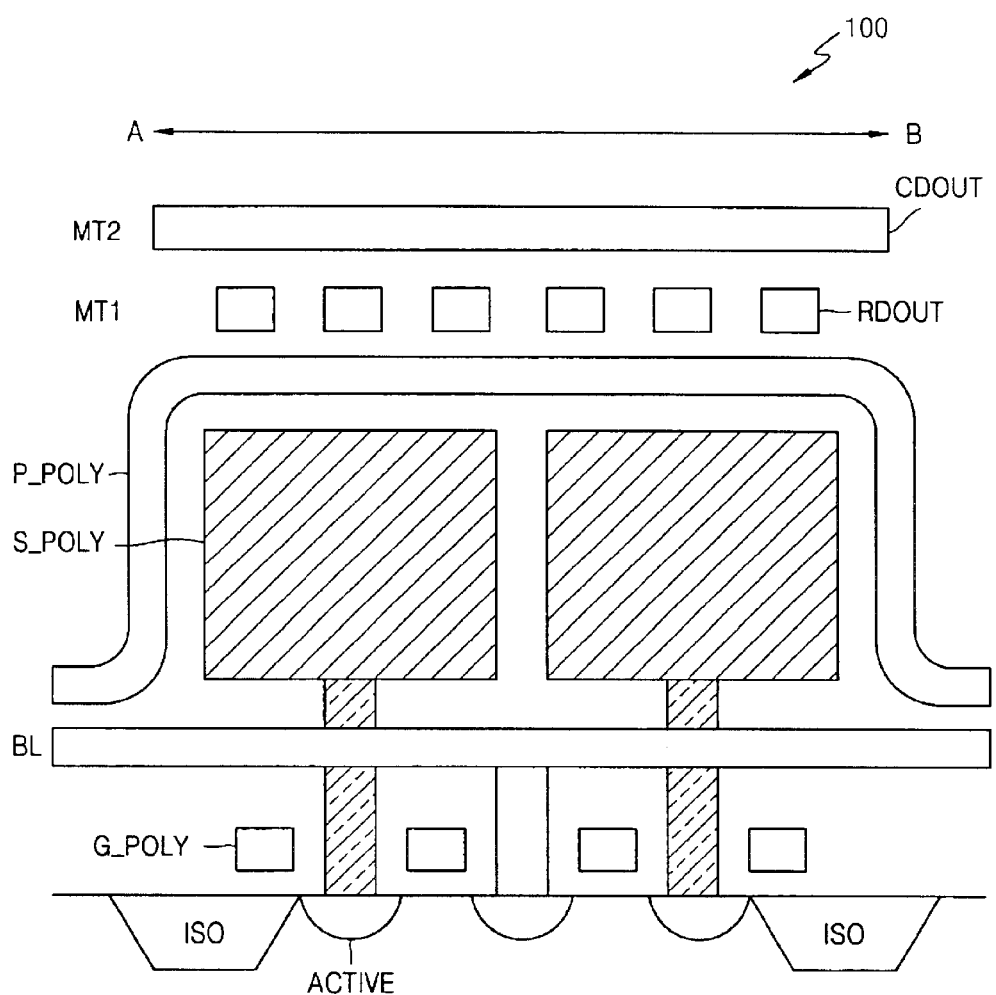
FIG. 2 is a side view of an array signal structure of the conventional semiconductor memory device shown in FIG. 1.

In the semiconductor memory device 200 of FIG. 2, the outputs RDOUT of the row decoder, which pass over the S/A block, are disposed as the first metal layer MT1 over the plate-poly silicon P_POLY. Also, the output lines CDOUT of the column decoder are disposed as the second metal layers MT2 over the output lines RDOUT of the row decoder. Since the output lines RDOUT of the row decoder are adjacent to the plate-poly silicon P_POLY, an electric bridge is formed between the output lines RDOUT of the row decoder and the plate-poly silicon P_POLY due to fine particles. As a result, the voltage level of the output lines RDOUT of the row decoder becomes unstable.

In the semiconductor memory device 300 of FIG. 4, the output lines CDOUT of the column decoder, which pass over the MCAB, are disposed as the first metal layer MT1 over the plate-poly P_POLY. Also, the output lines RDOUT of the row decoder are disposed as the second metal layers MT2 over the output lines CDOUT of the column decoder.

Accordingly, since the output lines RDOUT of the row decoder are not disposed adjacent to the plate-poly P_POLY, the voltage level of the output lines RDOUT of the row decoder does not become unstable due to fine particles.

Figure 5:
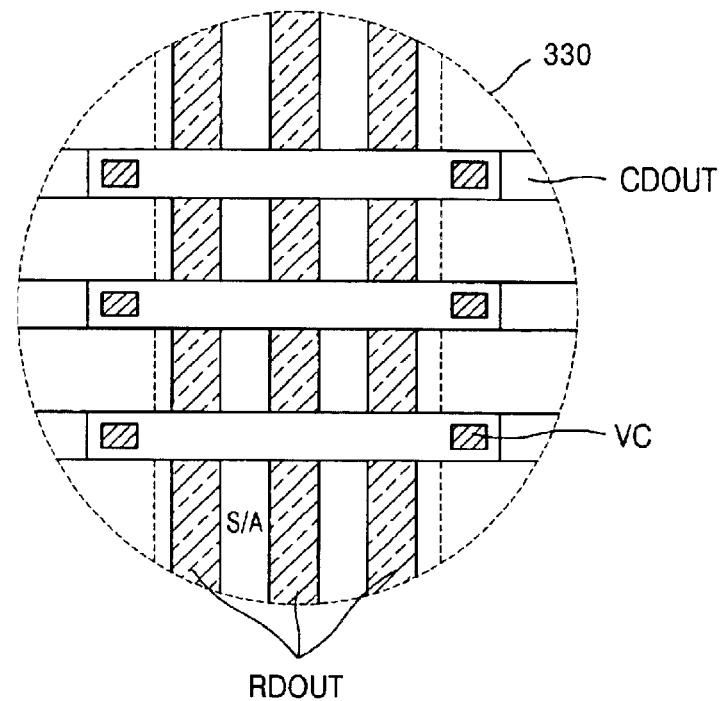
FIG. 5 is a schematic view of an S/A block of FIG. 3.

FIG. 5 is a schematic view of the S/A block of FIG. 3. Referring to FIG. 5, the second lines RDOUT are disposed over the S/A block, and the first line CDOUT are disposed over the second lines RDOUT. In other words, the output lines RDOUT of the row decoder 310 are disposed over the S/A block, and the output lines CDOUT of the column decoder 320 are disposed over the output lines RDOUT of the row decoder 310.

Figure 6:
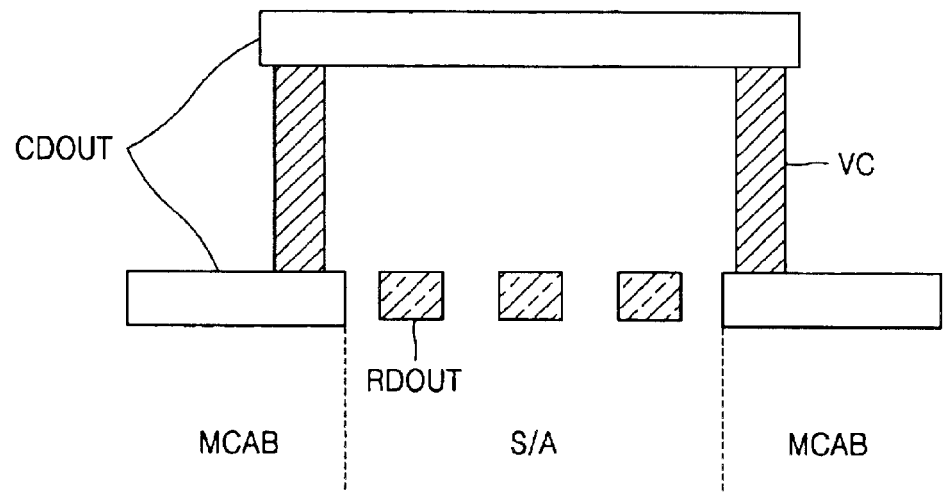
FIG. 6 is a side view of the S/A block of FIG. 5.

FIG. 6 is a side view of the S/A block of FIG. 5. Referring to FIG. 6, the output lines CDOUT of the column decoder 320 are disposed as the second metal layers MT2 over the output lines RDOUT of the row decoder 310 in the S/A block, and as the first metal layers MT1 under the output lines RDOUT of the row decoder 310 in the MCAB.

The output lines CDOUT of the column decoder 320 formed of the second metal layers MT2 over the S/A block are connected to the output lines CDOUT of the column decoder 320 formed of the first metal layers MT1 over the MCAB via a VC. Thus, an increase in the size of the semiconductor memory device 400 is not required.

The semiconductor memory device 300 includes first and second lines. Here, the first lines are the output lines CDOUT of the column decoder 320, and the second lines are the output lines RDOUT of the row decoder 310.

The first lines CDOUT pass over the MCAB and the S/A block. The second lines RDOUT pass over the MCAB and the S/A block.

The second lines RDOUT are disposed over the first lines CDOUT in the MCAB, and the first lines CDOUT are disposed over the second lines RDOUT in the S/A block. The first lines CDOUT are orthogonal to the second lines RDOUT.

As described above, in various exemplary embodiments of the semiconductor memory device according to the present invention, a specific node to which a boosting voltage is applied cannot form an electric bridge with another node. The level of the boosting voltage can be prevented from becoming unstable.

In addition, the area of an SIA block does not need to be increased.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor memory device comprising:
    a memory cell array block;
    a sense amplifier block disposed adjacent to the memory cell array block;
    a column decoder disposed at one side of the memory cell array block;
    a row decoder disposed at another side of the memory cell array block;
    first output lines of the row decoder that pass over the sense amplifier block and are formed of first metal layers;
    second output lines of the row decoder that pass over the memory cell array block and are formed of second metal layers;
    output lines of the column decoder that pass over the sense amplifier block and the memory cell array block, portions of the output lines of the column decoder passing over the sense amplifier block being formed of the second metal layers and portions of the output lines of the column decoder that pass over the memory cell array block being formed of the first metal layers.

2. The semiconductor memory device of claim 1, wherein a normal word line enable signal is transmitted to the second output lines of the row decoder which pass over the memory cell array block.

3. The semiconductor memory device of claim 1, wherein a column select line signal is transmitted to the output lines of the column decoder.

4. The semiconductor memory device of claim 1, wherein the portions of the output lines of the column decoder which pass over the sense amplifier block are connected to the portions of the output lines of the column decoder which pass over the memory cell array block via a via contact.

5. The semiconductor memory device of claim 1, wherein the second metal layers are disposed over the first metal layers.

6. A semiconductor memory device comprising:
    a plurality of data storage cells;

a plate-poly which encloses the data storage cells;

first lines which are disposed over the plate-poly and that transmit a column select line signal; and a first set of second lines which are disposed over the first lines and that transmit a normal word line enable signal.

7. The semiconductor memory device of claim 6, wherein the first lines are orthogonal to the second lines.

8. The semiconductor memory device of claim 6, further comprising:

a sense amplifier block; and a second set of second lines disposed over the sense amplifier block, the first lines disposed over the second set of second lines.

9. The semiconductor memory device of claim 8, wherein portions of the first lines over the sense amplifier block are connected to portions of the first lines over the plate-poly via a via contact.

10. A semiconductor memory device comprising:

first lines which pass over a memory cell array block and a sense amplifier block; and second lines which pass over the memory cell array block and the sense amplifier block, wherein the second lines are disposed over the first lines in the memory cell array block, and the first lines are disposed over the second lines in the sense amplifier block.

11. The semiconductor memory device of claim 10, wherein the first lines are orthogonal to the second lines.

12. The semiconductor memory device of claim 10, wherein a column select line signal, which is output from a column decoder, is transmitted via the first lines.

13. The semiconductor memory device of claim 10, wherein a normal word line enable signal, which is output from a row decoder, is transmitted via the second lines.

14. The semiconductor memory device of claim 10, wherein portions of the first lines over the sense amplifier block are connected to portions of the first lines over the memory cell array block via a via contact.

15. A method of forming a semiconductor memory device comprising:

forming first lines which pass over a memory cell array block and a sense amplifier block; and forming second lines which pass over the memory cell array block and the sense amplifier block, the second lines disposed over the first lines in the memory cell array block, and the first lines disposed over the second lines in the sense amplifier block.

16. The method of claim 15, further comprising:

forming a column decoder that outputs a column select line signal to the first lines; and forming a row decoder that outputs a normal word line enable signal to the second lines.

17. The method of claim 15, wherein the first lines are orthogonal to the second lines.

18. The method of claim 15, further comprising forming a via contact that connects portions of the first lines over the sense amplifier block to portions of the first lines over the memory cell array block.

* * * * *